(12) United States Patent
Whiteley et al.

(10) Patent No.: US 9,864,594 B1
(45) Date of Patent: Jan. 9, 2018

(54) SOFTWARE UPGRADE AND OPERATION TESTING OF A PACKAGED ELECTRONIC DEVICE

(71) Applicant: Amazon Technologies, Inc., Seattle, WA (US)

(72) Inventors: Michael Dale Whiteley, Redmond, WA (US); Anastasios Iliopoulos, Seattle, WA (US); Rohan Mutagi, Redmond, WA (US); Bo Li, Seattle, WA (US); Fred Torok, Seattle, WA (US); Ian Daniel Lehmann, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 48 days.

(21) Appl. No.: 14/501,601

(22) Filed: Sep. 30, 2014

(51) Int. Cl.
| | |
|---|---|
| *G06F 9/445* | (2006.01) |
| *G06F 11/36* | (2006.01) |
| *H04B 7/26* | (2006.01) |
| *H03M 13/09* | (2006.01) |
| *H04B 5/00* | (2006.01) |
| *H04W 52/02* | (2009.01) |

(52) U.S. Cl.
CPC ............ *G06F 8/65* (2013.01); *G06F 9/44505* (2013.01); *G06F 11/3688* (2013.01); *H03M 13/09* (2013.01); *H04B 5/0037* (2013.01); *H04B 5/0075* (2013.01); *H04B 7/26* (2013.01); *H04W 52/0274* (2013.01)

(58) Field of Classification Search
CPC .... G06F 8/65; G06F 9/44505; G06F 11/1004; G06F 11/368; G06K 7/10158; G06K 19/0701; G06K 19/0715; G06K 19/0723; H04W 52/0274
See application file for complete search history.

(56) References Cited

U.S. PATENT DOCUMENTS

| | | | | |
|---|---|---|---|---|
| 6,876,295 | B1 * | 4/2005 | Lewis ................... | H04B 5/0062 340/10.1 |
| 7,149,884 | B2 * | 12/2006 | O'Connor ........... | G06F 9/44505 700/96 |
| 7,825,776 | B2 * | 11/2010 | Smith .................. | G06F 9/44505 340/10.51 |
| 8,477,045 | B2 * | 7/2013 | Laffey ................. | G06F 9/44505 340/10.1 |

(Continued)

*Primary Examiner* — Joseph Kudirka
(74) *Attorney, Agent, or Firm* — Eversheds Sutherland (US) LLP

(57) ABSTRACT

Embodiments of the disclosure permit upgrading software and/or testing operation of an electronic device within an unopened package. In one embodiment, an electronic device can be powered on inductively while contained in its unopened packaging. In other aspects, the powered on electronic device can receive a software upgrade and/or test information. In addition, the electronic device can validate the software upgrade, and can replace software present in the electronic device with the received software upgrade. The electronic device also can validate at least a portion of the test information, and can implement one or more tests as conveyed in the test information. Further, the electronic device can communicate information wirelessly in response to the test(s). Such information can be indicative or otherwise representative of one or more results of the implemented test(s).

21 Claims, 8 Drawing Sheets

(56) References Cited

U.S. PATENT DOCUMENTS

| | | | |
|---|---|---|---|
| 8,849,708 B2 | 9/2014 | Somayajula et al. | |
| 2003/0182414 A1* | 9/2003 | O'Neill | G06F 8/65 709/223 |
| 2005/0251798 A1* | 11/2005 | Fraley | G06F 8/65 717/168 |
| 2006/0046736 A1* | 3/2006 | Pering | H04B 1/1615 455/452.2 |
| 2010/0156639 A1 | 6/2010 | Herwig et al. | |
| 2012/0311555 A1* | 12/2012 | Nijenkamp | G06F 8/65 717/170 |
| 2013/0144991 A1* | 6/2013 | Skalsky | G06F 15/177 709/220 |

\* cited by examiner

SOFTWARE UPGRADE AND OPERATION TESTING OF A PACKAGED ELECTRONIC DEVICE

BACKGROUND

After an electronic device is packaged, upgrades to the device's firmware or other software are generally unfeasible. As such, the electronic device may be upgraded or otherwise initialized with adequate software prior to utilization by a consumer. Such an upgrade or initialization may be lengthy, which may inconvenience the consumer or, in other cases, may cause the electronic device to not operate as intended.

BRIEF DESCRIPTION OF THE DRAWINGS

The accompanying drawings form part of the disclosure and are incorporated into the subject specification. The drawings illustrate example embodiments of the disclosure and, in conjunction with the present description and claims, serve to explain at least in part various principles, features, or aspects of the disclosure. Certain embodiments of the disclosure are described more fully below with reference to the accompanying drawings. However, various embodiments of the disclosure can be implemented in many different forms and should not be construed as limited to the implementations set forth herein. Like numbers refer to like elements throughout.

DETAILED DESCRIPTION

Figure 1:
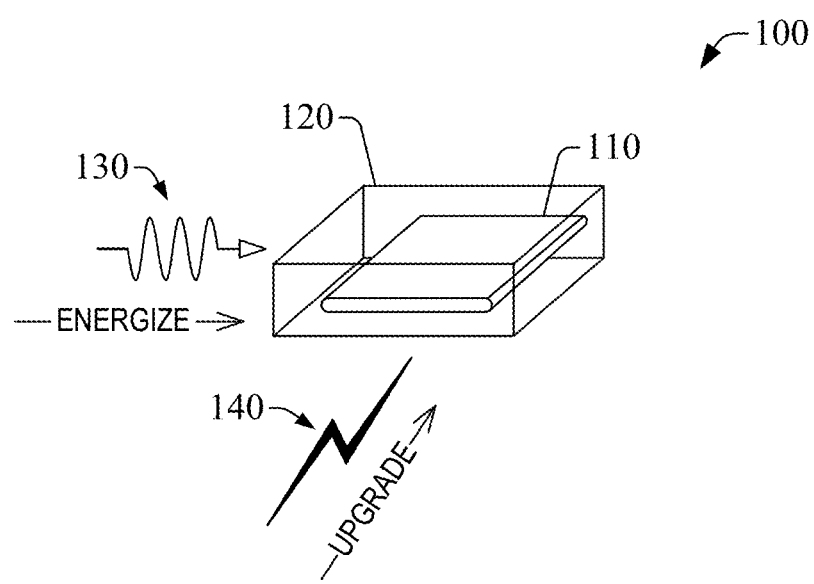
FIG. 1 illustrates an example of software upgrade of a packaged electronic device in accordance with one or more embodiments of the disclosure.

The disclosure recognizes and addresses, in at least certain embodiments, the issue of upgrading information in packaged electronic devices and/or probing such devices without removal from their original packaging. More particularly, yet not exclusively, the disclosure recognizes, and addresses, the inconvenience associated with upgrading the software present in an electronic device after the device has been unpacked after purchase and prior to its initial use. Similarly, delivery of operationally faulty electronic devices also can be difficult or inconvenient to the buyer that receives such a device. In accordance with embodiments of this disclosure, an electronic device can have specific functionality and therefore, can include computing resources (e.g., one or more processors and one or more memory devices) and communication resources, such as communication devices (e.g., a system bus, a memory bus, or the like), input/output interface(s), and/or a radio unit for wireless communication. In addition, the electronic devices described herein can include components (such as chipsets or circuitry) that can permit inductive generation of electric power that can be supplied to at least a portion of the electronic device. Accordingly, the electronic devices disclosed herein can be embodied in or can include a tethered computing device or a portable computing device, such as a mobile tablet computer, an electronic-book reader (also referred to as e-reader), a mobile telephone (e.g., a smartphone), and the like. In another example, the communication device can be embodied in or can include a wearable computing device, such as a watch, goggles or head-mounted visors, or the like. In yet another example, the communication device can be embodied in or can include portable consumer electronics equipment, such as a camera, a media reproduction device, a portable television set, a gaming console, a navigation device, a voice-over-internet-protocol (VoIP) telephone, and the like.

As described in greater detail below, the disclosure provides certain embodiments for upgrading information and/or testing operation of packaged electronic devices. Upgrading such information can include installing the information for a first time in a packaged electronic device, and/or replacing or otherwise modifying information in existence or otherwise present in the packaged electronic device with the information. In one aspect, an electronic device in accordance with this disclosure can transition or otherwise switch from a power-on state to a power-off state while contained in its unopened packaging. After such a transition, the electronic device can be referred to as being energized. More specifically, in certain embodiments, the electronic device can be caused to transition from the power-on state to the power-off state inductively, where a wireless receiver of the electronic device can receive a signal, and other components or circuitry of the electronic device can retain an induced current into one or more energy storage device. The electronic device can utilize at least a portion of the stored electrical energy and/or can transform the induced current to power on one or more components of the electronic device. In certain embodiments in which the electronic device includes a battery or other energy storage device suitably charged, the received signal can trigger usage of the energy stored in the battery or the energy storage device to power on the one or more components of the electronic device. Regardless of the source of energy, in one aspect, a control unit can regulate the component(s) that can be powered on (e.g., can transition from a power-off state to a power-on state) within the electronic device.

In other aspects, after or upon an electronic device is powered on either inductively or via a charged battery while contained in an unopened package (e.g., a new, closed retail box), a software module and/or test information can be received at the electronic device. In certain embodiments, the software module can be embodied in or can include a group of computer-accessible instructions and/or computer-accessible information (e.g., data structures and/or metadata), and can represent software, firmware, or specific information for certain functionality of the electronic device and/or for management of the device. In addition, the electronic device can validate the software module, and can replace or otherwise modify existent software with the received software module and/or can perform an initial installation of the received software module. The electronic device also can validate at least a portion of the test information that is received, and can implement one or more tests as conveyed in the test information. Further, the electronic device can communicate information wirelessly in response to the test(s). Such information can be indicative or otherwise representative of one or more results of the implemented test(s). In contrast with certain conventional technologies or modalities for remote information upgrade or operation testing, certain aspects of the disclosure can permit non-invasively configuring and/or probing a packaged electronic device without removal of the electronic device from its packaging.

With reference to the drawings, FIG. 1 illustrates a diagram 100 of an example of a software upgrade of a packaged electronic device in accordance with one or more embodiments of the disclosure. As illustrated, an electronic device 110 (which also may be referred to as device 110) can be contained in an unopened package 120 that can be formed of or can include materials (such as cardboard, plastics, combinations thereof, or the like) that can permit propagation of electromagnetic radiation into the interior of the unopened package 120. For instance the unopened package 120 can be embodied in or can include an unopened retail box containing the electronic device 110. In one aspect, the electronic device 110 can receive wirelessly a signal 130, such as an electromagnetic signal having wavelengths in the infrared (IR) portion of the electromagnetic spectrum or other predetermined portion thereof. The signal 130 can be referred to as an inductive signal, and can be received from a source (e.g., a charging device) disposed in proximity of the unopened package 120. As such, the electronic device 110 can include a receiver, such as an inductive receiver (e.g., multiple electrically conducting coils). In certain implementations, such a receiver may be embodied in or can include a near field communication (NFC) receiver. In certain embodiments, prior to transmitting the signal 130, such a source can determine if the unopened package 120 containing the electronic device 110 is present. Such a determination can be performed in numerous ways. In one example, the source can include detection circuitry that in proximity to the unopened package can produce a signal (which may be referred to as a "presence" signal) that indicates that the unopened package is present and contains the electronic device.

In certain embodiments, the signal 130 can cause the electronic device 110 to transition inductively from a power-off state to a power-on state. To at least such an end, in one example, the electronic device 110 can include circuitry or other unit(s) that can generate power using at least a portion of the received signal 130. The power can be generated according to a protocol for wireless charging, and can be supplied to one or more components of the electronic device 110. More particularly, yet not exclusively, such component(s) can include a wireless receiver or a radio unit, a bus, a memory manager unit, and one or more memory devices (referred to as memory) functionally coupled to the memory manager unit via the bus, for example. In one embodiment, the electronic device 110 can include a control unit (or a controller) that also can be powered on and can control the generated power supply to the one or more components.

In embodiments in which the electronic device 110 includes a battery or other energy storage device, the signal 130 can trigger usage of the energy stored in the battery or the energy storage device to power on the one or more components of the electronic device 110. As such, in one implementation, the control unit that can be included in the electronic device 110 can determine a level of charge present in the battery or an amount of energy stored in the energy storage device. It should be appreciated that, in one implementation, the control unit can be powered on (e.g., can be caused to transition from a power-off state to a power-on state) via the battery or the energy storage device. In a state in which such a level or amount is above a threshold that permits powering on one or more components of the electronic device 110, the control unit can enable the supply of power to the one or more components from the battery or the energy storage device. Accordingly, the one or more components can be powered on via the battery or the energy storage device, without inductive generation of energy to power on such component(s).

In other embodiments in which the layout of the electronic device 110 can preclude or otherwise make difficult powering on the electronic device 110 inductively via the signal 130, the unopened package 120 can be functionally coupled (e.g., electromechanically coupled) to a power receiver (not shown in FIG. 1) which can generate power inductively via the signal 130. Such a power receiver also can be functionally coupled to the electronic device 110. For instance, the power receiver can be inductively coupled to the electronic device 110, can be directly electrically coupled via wires connected to the electronic device 110. In one example, one or more pins or other types of connector or adapters can permit the direct electric coupling between the power receiver and the electronic device 110. As such, power generated at the power received can be relayed or otherwise supplied to the electronic device 110, which can permit powering on the electronic device 110.

In certain embodiments the unopened package 120 can be wholly or partially conductive and can be inductively powered on via the signal 130. At least a portion of such an unopened package 120 can be inductively coupled or directly electrically attached to the electronic device 110 in order to power on the electronic device 110 in a fashion similar to the power receiver described herein. In one example, the electronic device 110 may be embodied in or can include a smart light bulb that can be powered on via the conductive, unopened package 120. In particular, yet not exclusively, a chipset that provides certain intelligence to the light bulb may be powered on. Such a chipset also can include or be functionally coupled to a second chipset including a transceiver for wireless communication which may permit receiving information at the light bulb in accordance with aspects described herein.

After or upon being powered on (inductively or otherwise), the electronic device 110 can receive information wirelessly. The information can be conveyed in a signal 140, which can be an electromagnetic signal, encoded and modulated according to a specific radio technology protocol, such as NFC, Third Generation Partnership Project (3GPP) Long Term Evolution (LTE), LTE Advanced (LTE-A), 3G, WiMax, Wi-Fi, Bluetooth, ZigBee, or the like. The signal 140 may be referred to an "inductive signal" and can include data, metadata, and/or signaling. In one example, the information can be embodied in or can constitute a software module, and can be indicative or otherwise representative of a software upgrade, including a firmware upgrade, an operating system (OS) upgrade, and/or other information—e.g., software, such as applications; firmware; digital media, such as songs, photographs, and videos; configuration profiles; connectivity or networking credentials, such as Wi-Fi credentials; user profiles; preferences; passwords; songs, photographs, videos, or the like—that may be retained in the electronic device 110. It should be appreciated that, in one aspect, the electronic device 110 can receive the signal 140 via a radio unit that can be powered on by the power supplied by the signal 130 or by a suitably charged battery or energy storage device.

It should be appreciated that, in certain embodiments, the principles of the present disclosure may be applied to two or more electronic devices—e.g., a television set and an associated remote control; two or more smart light bulbs; a hub and three smart light bulbs; or the like. In such embodiments, the signal 130 can be utilized or otherwise leveraged to cause the two or more electronic devices to transition from a power-off state to a power-on state, and the signal 140 can convey information specific to each of the two or more powered on electronic devices, and second information specific to at least one pair of the two or more electronic devices. For instance, the unopened package 120 can include a hub and one or more smart light bulbs, and the second information can pair the hub and each of the one or more smart light bulbs. It should be appreciated that, in such an example, powering on the smart light bulb(s) can cause at least one of the smart light bulb(s) to identifying information (e.g., an electronic serial number (ESN) or other type of code information) that identifies or otherwise characterizes the at least one of the smart light bulb(s). The identifying information can be utilized or otherwise leveraged to pair the hub to the at least one of the smart light bulb(s). In addition or in the alternative, at least one of the two or more devices can receive information via the signal 140 that can specify a relationship (e.g., a pairing) between the at least one device and another device deployed or otherwise installed in a network configured to include the at least one electronic device.

It should be appreciated that, in certain embodiments, the electronic device 110 may be powered on for energy storage purposes (or charging purposes) rather than for upgrading software. For instance, in one such embodiment, the electronic device 110 can utilize the power (or current) inductively generated by receiving the signal 130 to charge a battery or energy storage device contained in the electronic device 110. In certain implementations, the electronic device 110 may supply the inductively generated power to the battery or energy storage device when the amount of energy available in the battery or energy storage device is at or below a predetermined level. The inductively generated power may be supplied to the battery or the energy storage device in order to attain a satisfactory (e.g., full charge or full storage) or otherwise desired amount of stored energy.

Figure 2A:
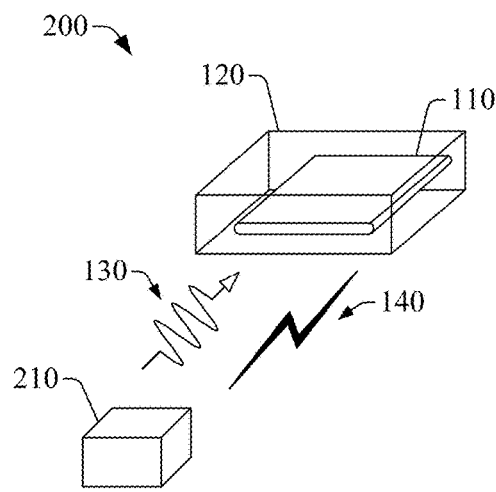
FIGS. 2A-2B illustrate examples of operational environments that permit software upgrades or testing of an electronic device in accordance with one or more embodiments of the disclosure.

In certain embodiments, such as the example operational environment 200 shown in FIG. 2A, an electronic device 210 (wireless or tethered) can communicate (e.g., transmit) the signal 130 to the electronic device 110. For instance, the electronic device 210 can be disposed in the proximity of the unopened package 120, and can transmit the signal 130 via a short-range radio technology protocol (e.g., NFC or Bluetooth) or another protocol suitable for wireless charging (short-ranged or otherwise). As described herein, the signal 130 can cause the electronic device 110 to power on, e.g., to transition from a power-off state to a power-on state. The electronic device 210 also can transmit the signal 140, which can convey information, via the same or a different short-range radio technology protocol. It can be appreciated that the amount of information to be conveyed in the signal 140 can determine, at least in part, the type of short-range radio technology protocol that can be utilized. In one embodiment, at least a portion of the information that the electronic device 210 transmits to the electronic device 110 can be retained or otherwise stored locally at the electronic device 210. In another embodiment, at least a portion of the information transmitted to the electronic device can be received from a remote device via one or more networks. While not depicted in FIG. 2A, the remote device can be communicatively coupled to one or more of such network(s), and a second one of such network(s) can be communicatively coupled to the electronic device 210. The network(s) (not shown) can include wireless and/or wired communication network(s) having various footprints (e.g., wide area network (WAN), metropolitan area network (MAN), a local area network (LAN) or other confined-area network (CAN), and/or a personal area network (PAN)).

Figure 2B:
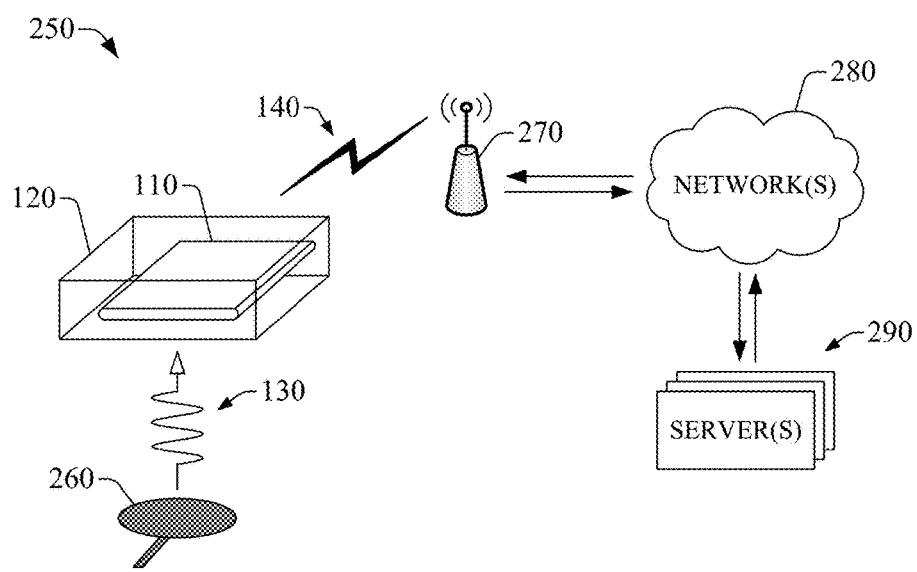

In other embodiments, such as the example operational environment 250 shown in FIG. 2B, a charging device 260 (e.g., a charging plate) disposed in proximity of the unopened package 120 can transmit the signal 130 via an energy charging protocol (such as the Qi protocol from the Wireless Power Consortium). In certain scenarios, the charging device 260 can be disposed onto a shelf or other surface that supports the unopened package 120. It should be appreciated that while depicted as being localized in a specific area, the disclosure also contemplates that the charging device 260 may be spatially extended. More specifically, as an example, the charging device 260 can form an elongated band that is disposed along a shelf. As another example, the charging device can be embodied in or can include a charging coil embedded into a shelf. In addition, a base station 270 (such as a low-power access point) can communicate the signal 140 via a radio technology protocol (e.g., Wi-Fi, Bluetooth, or cellular) suitable for communication with the electronic device 110 after it transitions for a power-off state to a power-on state.

As illustrated, the base station 270 can be functionally coupled to at least one of a group of networks 280 that can permit the exchange of information between the base station 270 and at least one of a group of servers 290. In one aspect, the group of servers 290 can provide at least a portion of the information conveyed in the signal 140. In another aspect, the group of networks 280 can include wireless and/or wired communication network(s) having various footprints (e.g., a WAN, a MAN, a LAN or other CAN, and/or a PAN). For instance, the base station 270 and at least a portion of the group of networks 280 can form or can be included in LAN deployed in a factory in which the electronic device 110 is packaged or a fulfillment center in which the electronic device 110 is stored. While reference is made to one or more servers, it should be appreciated that the one or more networks of the group of networks 280 can permit functionally coupling (e.g., communicatively coupling) the base station 270 to other type of remote computing devices.

Figure 3:
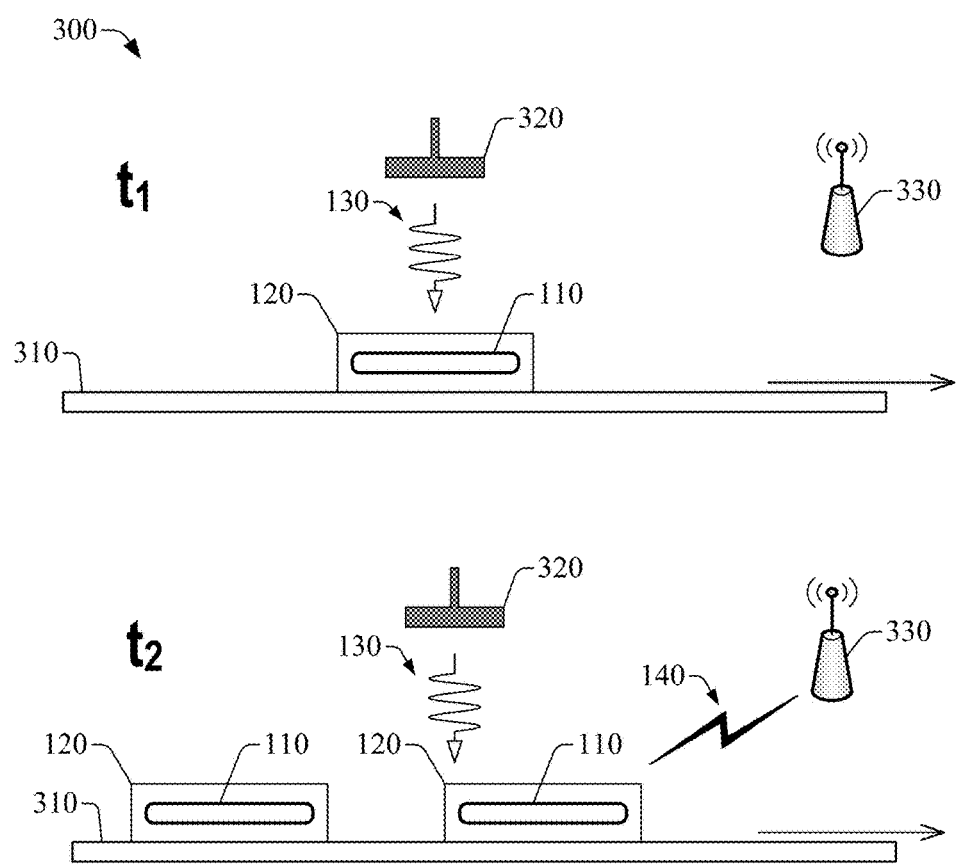
FIG. 3 illustrates another example of an operational environment that permits software upgrades or testing of an electronic device in accordance with one or more embodiments of the disclosure.

The unopened package 120 need not be stationary. In certain scenarios, as illustrated in the example operational environment 300 shown in FIG. 3, the unopened package 120 can be motion (represented with a horizontal arrow). For example, the unopened package 120 can be disposed or otherwise located in an assembly line for the electronic device 110 or in a distribution line at a fulfillment center. More specifically, the unopened packaged 120 can be disposed on a conveyor belt 310 and, at a time (depicted as $t_1$) in which the unopened package 120 is in proximity of a charging device 320, the electronic device 110 can be powered on—e.g., can be caused to transition from a power-off state to a power-on state—via the signal 130 in accordance with aspects described herein. In one implementation, the charging device 320 can emit the signal 130 continually or intermittently (e.g., every few microseconds, every few milliseconds, every few seconds, or the like). In another implementation, the charging device 320 can emit the signal 130 in synchronization with the rate at which unopened packages containing respective electronic device are disposed or otherwise placed in proximity of the charging device. As such, in one aspect, the charging device 320 can emit the signal 130 at times in which electronic devices are sufficiently close so as to be powered on. In certain embodiments, prior to transmission of the signal 130, the charging device 320 can determine if the unopened package 120 containing the electronic device 110 is present or otherwise suitably disposed to receive the signal 130. In one example, the charging device 320 can include detection circuitry that in proximity to the unopened package 120 can produce a signal (which may be referred to as a "presence" signal) that indicates that the unopened package 120 is present or otherwise suitably disposed to receive the signal 130 and contains the electronic device 110. In other embodiments, the charging device 320 can receive a presence indication via a remote device and/or sensor. For instance, an image from a camera (not depicted) can be analyzed (e.g., utilizing computerized vision) by a remote computing device in order to determine that the unopened package 120 is present and suitably disposed to receive the signal 130. In addition, the weight of the unopened package 120 can be measured and compared to a reference weight indicative of the unopened package 120 containing the electronic device 110. To at least such an end, in one embodiment, a weight scale (not depicted) can be integrated into or coupled to the conveyor belt 310, and can transmit information indicative of the weight of the unopened package 120 to the charging device 320 or other device that can compare the weight to the reference weight and thus determine the presence of the electronic device 110 within the unopened package 120. In response to a determination that the unopened package 120 containing the electronic device 110 is present or otherwise suitably disposed to receive the signal 130, the charging device 320 can be instructed to transmit the signal 130. In one example, the device that performs such a determination can communicate (e.g., transmit) the instruction to transmit the signal 130.

While in the illustrated embodiment the charging device 320 is disposed or otherwise installed above the conveyor belt 310, other arrangements of the charging device 320 relative to the conveyor belt 310 that permit the signal 130 to reach the unopened package 120 and the electronic device 110 can be contemplated. In addition, in other embodiments, the charging device 320 can be replaced by a charging coil and/or other type of charging device embedded or otherwise attached to the conveyor belt 310. The charging coil and/or the charging device can provide the functionality of the charging device 320 in accordance with one or more aspects described herein.

At a time (depicted as $t_2$) after the electronic device 110 is powered on (e.g., the electronic device 110 has transitioned from a power-off state to a power-on state), a base station 330 (such as a Wi-Fi access point) can transmit wirelessly the signal 140 in accordance with aspects described herein. While not shown, the base station 330 can be functionally coupled (e.g., communicatively coupled) to a remote server or other type of computing device via one or more networks. For instance, the remote server can be embodied in or can include one of server(s) 290, and the one or more networks can be embodied in or can include the group of networks 280. As time progresses and the conveyor belt 310 continues to roll, another unopened package 120 can be disposed in proximity of the charging device 320, which can emit the signal 130, thereby powering on another electronic device 110 contained in the other unopened package 120 that becomes proximate to the charging device 320. The other electronic device 110 can subsequently receive information via the signal 140 from the base station 330.

Regardless of the specific implementation to receive the signal 140, the electronic device 110 can validate at least a portion of the information received via the signal 140 prior to upgrading or otherwise configuring the electronic device 110. As such, the electronic device 110 can determine if the information received wirelessly via the signal 140 has been received correctly (e.g., without transmission errors). In addition, the electronic device 110 can determine if the information (e.g., a software upgrade) is provided by a legitimate source. In the event of an affirmative determination, the information can be validated and the electronic device 110 can retain the information received via the signal 140. In the alternative, after the source of the information is determined to be legitimate, the electronic device 110 may determine if the type of information, e.g., the version and/or content type of an upgrade, is adequate for the electronic device 110. A positive determination can cause the electronic device 110 to retain the information received via the signal 140. For example, the electronic device 110 can include a validation unit or other component(s) that can authenticate or otherwise determine the validity of the received information. More generally, a positive determination of the correctness of the information wirelessly received at the electronic device 110 (e.g., lack of transmission errors, legitimate source of the information, correct type of information, and the like) can cause the electronic device 110 to transmit or otherwise communicate wirelessly a signal confirming the correct reception of the software module.

In certain implementations, in order to authenticate or otherwise validate at least a portion of the received information, the validation unit can determine a verification value (e.g., a checksum value or hash value) by computing a verification function (e.g., a checksum algorithm or hash function) that utilizes as an argument the received information. For instance, the verification function can include a checksum algorithm (e.g., a cyclic redundancy check (CRC)) or a hash function, and the verification value can include a checksum value or a hash value. As such, in one example, the validation unit can compute a CRC value in order to authenticate at least a portion of the information received (wirelessly or otherwise) at the electronic device 110. In certain scenarios, the information received via the signal 140 can be encrypted and the validation unit can check a hash value in order to authenticate at least a portion of the received information. It should be appreciated that the validation unit also can determine a hash value for non-encrypted information. Upon or after a verification value (which also may be referred to as an "error-detection value") is determined or otherwise available, the electronic device 110 can compare the verification value with a predetermined verification value. When the outcome of the comparison indicates that the verification value is the same as the predetermined verification value, the electronic device 110 can ascertain that the software module has been received correctly.

In other embodiments, an electronic device (or device) that can transmit the signals 130 and/or 140 also can evaluate the correctness of the information transmitted to the electronic device 110. For example, with reference to operational environment 200 shown in FIG. 2A, the electronic device 210 can include logic (e.g., certain modules embodied in or including computer-accessible instructions) that can permit regulating or otherwise controlling the communication of the information (data, metadata, and/or signaling) conveyed in the signal 140. More specifically, in certain embodiments, the electronic device 210 can leverage or otherwise utilize the logic to determine if a software module (e.g., software, a software upgrade, firmware, a firmware upgrades, digital media, credentials, digital files, and the like) transmitted to the electronic device 110 is received without errors or integrity issues. To at least such an end, in one implementation, the electronic device 210 can receive a verification value (also referred to as an error-detection value) from the electronic device 110 and a second verification value from the remote device (e.g., a server). In addition, the electronic device 210 can compare the verification value and the second verification value. When the outcome of the comparison indicates that the verification value is the same as the second verification value, it can be determined that the software module has been transmitted correctly to the electronic device 110. It should be appreciated that, in certain implementations, the electronic device 210 can determine other types of correctness of the software module transmitted to the electronic device 110. For instance, the electronic device 210 can determine, at least in part, that a source of software module is legitimate, the type of the software module is correct (e.g., compatible with the electronic device 110), a combination thereof, or the like. It should be appreciated that in connection with the communication of the signal 140 and the validation of the information conveyed therein, the base station 270 and the base station 330 can operate in substantially the same manner as the electronic device 210.

Verification of the correctness of the information received via the signal 140 can cause the electronic device 110 to receive further information wirelessly and to retain at least a portion of the received information. In certain embodiments, the electronic device 110 can include a control unit (or controller) that can supply power to a bus, a bus controller, a processor, and a memory device in order to store, configure, and/or apply the received information. After the information (e.g., a software upgrade) is configured in the electronic device 110, the controller can power off the electronic device 110. In one implementation, the controller can receive a signal conveying a directive for the electronic device 110 to transition from a power-on state to a power-off state. For instance, after or upon a determination that the software module has been correctly transmitted and received, the electronic device 210 can transmit, via the signal 140, a directive to the electronic device 110 to apply the software module. In a scenario in which the software module includes, for example, an executable file, such a directive can cause the electronic device 110 to execute the executable file in order to apply the software module.

In certain embodiments, the electronic device 110 also can be tested while contained in the unopened package 120. To at least such an end, in one implementation, a radio unit of the electronic device 110 can be powered on using the signal 130, and therefore, the electronic device 110 can receive test information via the signal 140. The test information can include, for example, a configuration directive indicative of other component(s) to be powered on using the power supplied by the signal 130. The test information also can include, for example, a test directive indicative of a specific test to be implemented by at least one of the component(s) that may be powered on. The electronic device can validate the test information and, in response, can power on the component(s) specified in the configuration information and can implement the test specified in the test directive. Implementation of such a directive can cause the electronic device 110 to communicate information indicative or otherwise representative of the results of the implemented test. The electronic device 110 can utilize or otherwise leverage the powered on radio unit to communicate such information. It can be appreciated that implementation of the test in accordance with aspects of this disclosure can permit performing non-invasive quality assurance prior to fulfillment of an order for the electronic device 110. As such, any malfunction of the electronic device 110 can be identified prior to delivery to a consumer.

Figure 4:
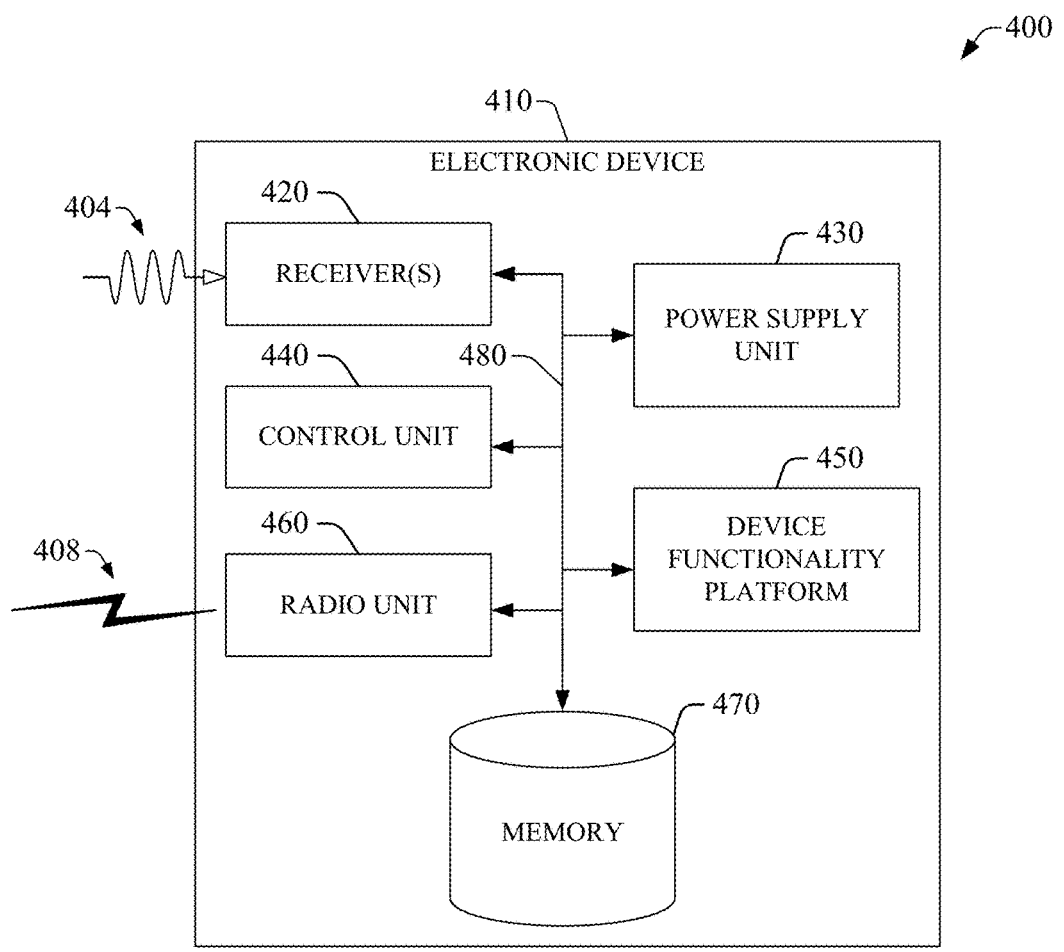
FIG. 4 illustrates an example of an electronic device in accordance with one or more embodiments of the disclosure.

FIG. 4 presents an example embodiment 400 of an example electronic device 410 that can be upgraded and/or probed while contained in an unopened package in accordance with one or more aspects of the disclosure. The electronic device 410 can include one or more wireless receivers 420 (e.g., one or more conducting coils) that can receive signal 404. The signal 404 can be similar to the signal 130. As such, the signal 404 can be monochromatic or polychromatic, having one or more wavelengths in a predetermined portion of the electromagnetic spectrum. In addition, the signal 404 can be modulated according to a specific power charging protocol or a radio technology protocol. At least one of the one or more wireless receivers 420 can relay or otherwise transmit at least a portion of the signal 404 to a power supply unit 430 which can generate power to power on one or more components of the electronic device 410. The power supply unit 430 also can store (capacitively store, for example) at least a portion of the generated power. The receiver(s) 420 and the power supply unit 430 may be collectively referred to, in certain implementations, as a power pick-up unit. As such, in certain embodiments, one or more of the receiver(s) may be integrated into a single unit (e.g., an integrated circuit (IC) or chipset).

In addition, the electronic device 410 can include a control unit 440 (which also may be referred to as a controller 440) that can draw an electric current from the power supply unit 430 and thus, can be powered on. In certain implementations, the powered on controller 440 can determine which component(s) of the electronic device 410 are to be powered on in response to received signal 404. In one example, the controller 440 can power on a radio unit 460 that can receive a signal 408 which can convey information (e.g., a software upgrade and/or test information) for the electronic device 410. The controller 440 also can analyze at least a portion of such information and can determine if the information is valid. To at least such an end, in one implementation, the controller 440 can include a component, such as a validation unit or one or more processors (not depicted), that can validate the information received via the signal 408. In response to a determination that received information is valid or otherwise correct, the controller 440 can route power from the power supply unit 430 to one or more components of the electronic device 410, including one or more memory devices 470 (which also may be referred to as memory 470). Accordingly, in certain implementations, the one or more components can be powered on, and can permit retaining at least a portion of the validated information in the memory 470. Therefore, the software available or otherwise present in the electronic device 410 can be upgraded.

In other implementations, the information that is received and validated by the controller can include test information directed to probe or otherwise evaluate the functionality of the electronic device 410. The controller 440 can utilize or otherwise leverage the test information to identify one or more components to be powered on, and to determine a test to be implemented. The test can be identified by one or more test directives included in the test information. Accordingly, the controller 440 or a component thereof (e.g., a selector unit or switch) can identify the one or more components, and can draw power from the power supply unit 430 to power on such component(s). The controller 440 can implement the test for the powered on component(s). At least one of the component(s) included in the test can report a result. In one example, the controller 440 can receive the result and can cause the radio unit 460 to communicate information indicative or otherwise representative of the result.

It should be appreciated that, in certain embodiments, each of the one or more wireless receivers 420, the power supply unit 430, and the controller 440 (or component(s) therein) can be embodied in or can include an IC, an application-specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed or otherwise configured to perform the functions described herein. While the wireless receiver(s) 420, the power supply unit 430, and the controller 440 are illustrated as separate in the electronic device 410, a combination of two or more such functional elements can be integrated into a single unit (e.g., a single chipset or circuitry) that can provide the functionality of such units in accordance with aspects described herein. Similarly, in some embodiments, the power supply unit 430 and/or the controller 440 can be integrated into the device functionality platform 450 in order to provide the functionality of such elements in accordance with aspects described herein. In the illustrated embodiment, the device functionality platform 450 can include units, modules, components, circuitry, and/or other functional elements that can provide specific functionality of the electronic device 410. For example, in an embodiment in which the electronic device 110 is a television set, the device functionality platform 450 can include lighting components (such as light emitting diodes), other display components, circuitry for power management, circuitry for encoding/decoding, one or more processors, memory devices, numerous adapters, and the like.

As illustrated, a bus architecture 480 can permit functionally coupling two or more of the functional elements included in the electronic device. As such, in certain embodiments, the bus 480 can include at least one of a system bus, a memory bus, an address bus, or a message bus, and can permit exchanging information (e.g., data, metadata, and/or signaling) between at least two of the receiver(s) 420, the power supply unit 430, the control unit 440, the device functionality platform 450, the radio unit 460, or the memory 470.

Figure 5:
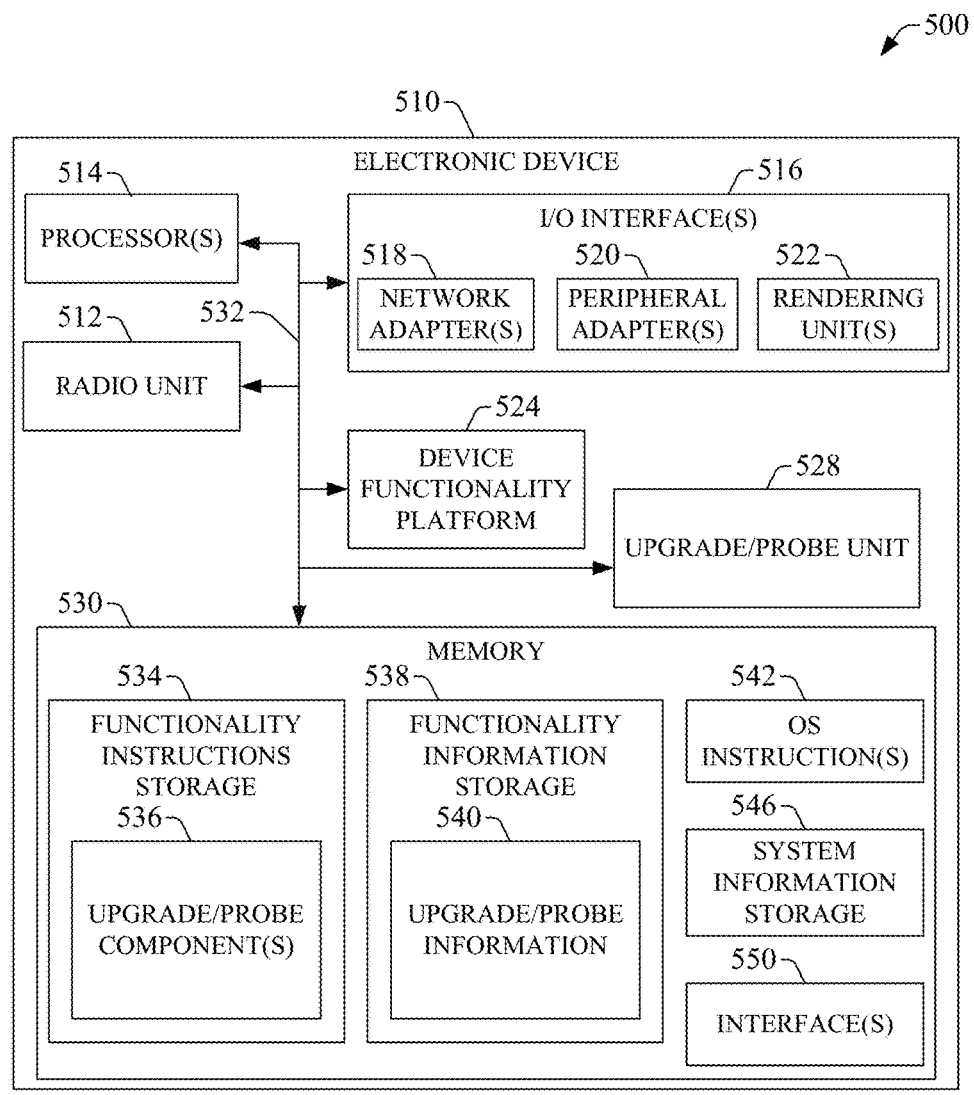
FIG. 5 illustrates another example of an electronic device in accordance with one or more embodiments of the disclosure.

FIG. 5 illustrates an example embodiment 500 of an electronic device 510 in accordance with one or more aspects of the disclosure. As illustrated, the example electronic device 510 represents an example implementation of the various aspects or features of the disclosure in which the processing or execution of operations described in connection with information upgrade and/or operational testing of packaged electronic devices disclosed herein can be performed in response to execution of one or more software components at the electronic device 510. Therefore, the electronic device 510 can embody or can include one or more of the devices described herein. In one embodiment, the electronic device can embody the electronic device 110. In another embodiment, the electronic device 510 can embody or can include the electronic device 210. In yet another embodiment, the electronic device 510 can embody or can include the base station 270. In still another embodiment, the electronic device 510 can embody or can include the base station 330. In another embodiment, the electronic device 510 can embody or can include the electronic device 410. Accordingly, the functional elements of the electronic device 510 can provide specific functionalities in connection with upgrade and/or operational testing in accordance with this disclosure.

It should be appreciated that the one or more software components can render the electronic device 510, or any other computing device that contains such components, a particular machine for information upgrade and/or operational testing of packaged device as described herein, among other functional purposes. A software component can be embodied in or can include one or more computer-accessible instructions, e.g., computer-readable and/or computer-executable instructions. In one scenario, at least a portion of the computer-accessible instructions can embody and/or can be executed to perform at least a part of one or more of the example methods described herein, such as the example methods presented in FIGS. 6-8. For instance, to embody one such method, at least the portion of the computer-accessible instructions can be persisted (e.g., stored, made available, or stored and made available) in a computer storage non-transitory medium and executed by a processor. The one or more computer-accessible instructions that embody a software component can be assembled into one or more program modules, for example, that can be compiled, linked, and/or executed at the electronic device 510 or other computing devices. Generally, such program modules include computer code, routines, programs, objects, components, information structures (e.g., data structures and/or metadata structures), etc., that can perform particular tasks (e.g., one or more operations) in response to execution by one or more processors, which can be integrated into the electronic device 510 or functionally coupled thereto.

The various example embodiments of the disclosure can be operational with numerous other general purpose or special purpose computing system environments or configurations. Examples of well-known computing systems, environments, and/or configurations that can be suitable for implementation of various aspects or features of the disclosure in connection with the information upgrade and/or operational testing of packaged electronic devices described herein can include personal computers; server computers; laptop devices; handheld computing devices, such as mobile tablets or electronic-book readers (e-readers); wearable computing devices; and multiprocessor systems. Additional examples can include set-top boxes; programmable consumer electronics; network personal computers (PCs); minicomputers; mainframe computers; blade computers; programmable logic controllers; distributed computing environments that include any of the above systems or devices; and the like.

As illustrated, the electronic device 510 can include one or more processors 514, one or more input/output (I/O) interfaces 516, a memory 530, and a bus architecture 532 (also termed bus 532) that functionally couples various functional elements of the electronic device 510. In certain embodiments, the electronic device 510 can include, optionally, a radio unit 512. The radio unit 512 can include one or more antennas and a communication processing unit that can permit wireless communication between the electronic device 510 and another device, such as a remote computing device and/or a remote sensor. Such a wireless communication can be implemented in accordance with one or more radio technology protocols, such as NFC, 3GPP LTE, LTE-A, 3G, WiMax, Wi-Fi, Bluetooth, ZigBee, or the like. In certain embodiments, the radio unit 512 can operate in substantially the same or the same manner as the radio unit 460. The bus 532 can include at least one of a system bus, a memory bus, an address bus, or a message bus, and can permit exchange of information (data, metadata, and/or signaling) between the processor(s) 514, the I/O interface(s) 516, and/or the memory 530, or respective functional elements therein. In certain scenarios, the bus 532 in conjunction with one or more internal programming interfaces 550 (also referred to as interface(s) 550) can permit such exchange of information. In scenarios in which processor(s) 514 include multiple processors, the electronic device 510 can utilize parallel computing.

The I/O interface(s) 516 can permit communication of information between the computing device and an external device, such as another computing device, e.g., a network element or an end-user device. Such communication can include direct communication or indirect communication, such as exchange of information between the electronic device 510 and the external device via a network or elements thereof. As illustrated, the I/O interface(s) 516 can include one or more of network adapter(s) 518, peripheral adapter(s) 520, and rendering unit(s) 522. Such adapter(s) can permit or facilitate connectivity between the external device and one or more of the processor(s) 514 or the memory 530. For example, the peripheral adapter(s) 520 can include a group of ports, which can include at least one of parallel ports, serial ports, Ethernet ports, V.35 ports, or X.21 ports. In certain embodiments, the parallel ports can include General Purpose Interface Bus (GPIB), IEEE-1284, while the serial ports can include Recommended Standard (RS)-232, V.11, Universal Serial Bus (USB), FireWire or IEEE-1394.

In one aspect, at least one of the network adapter(s) 518 can functionally couple the electronic device 510 to one or more remote computing devices or sensors (not depicted in FIG. 5) via one or more traffic and signaling pipes (not depicted) that can permit or facilitate exchange of traffic and/or signaling between the electronic device 510 and such one or more remote computing devices or sensors. Such network coupling provided at least in part by the at least one of the network adapter(s) 518 can be implemented in a wired environment, a wireless environment, or both. The information that is communicated by the at least one of the network adapter(s) 518 can result from the implementation of one or more operations of a method in accordance with aspects of this disclosure. Such output can be any form of visual representation, including, but not limited to, textual, graphical, animation, audio, tactile, and the like. In addition or in the alternative, depending on the architectural complexity of the electronic device 510, the rendering unit(s) 522 can include functional elements (e.g., lights, such as light-emitting diodes; a display, such as a liquid crystal display (LCD), a plasma monitor, a light emitting diode (LED) monitor, or an electrochromic monitor; combinations thereof; or the like) that can permit control of the operation of the electronic device 510, or can permit conveying or revealing the operational conditions of the computing device 510.

In one aspect, the bus 532 represents one or more of several possible types of bus structures, including a memory bus or a memory controller, a peripheral bus, an accelerated graphics port, and a processor or local bus using any of a variety of bus architectures. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnects (PCI) bus, a PCI-Express bus, a Personal Computer Memory Card International Association (PCMCIA) bus, a Universal Serial Bus (USB), and the like.

The electronic device 510 can include a variety of computer-readable media. Computer-readable media can be any available media (transitory and non-transitory) that can be accessed by a computing device. In one aspect, computer-readable media can include computer non-transitory storage media (or computer-readable non-transitory storage media) and communications media. Example computer-readable non-transitory storage media can be any available media that can be accessed by the electronic device 510, and can include, for example, both volatile and non-volatile media, and removable and/or non-removable media. In one aspect, the memory 530 can include computer-readable media in the form of volatile memory, such as random access memory (RAM), and/or non-volatile memory, such as read-only memory (ROM).

The memory 530 can include functionality instructions storage 534 and functionality information storage 538. The functionality instructions storage 534 can include computer-accessible instructions that, in response to execution (by at least one of the processor(s) 514), can implement one or more of the functionalities of the disclosure. The computer-accessible instructions can embody or can include one or more software components illustrated as upgrade/probe component(s) 536. In one scenario, execution of at least one component of the upgrade/probe component(s) 536 can implement one or more of the methods described herein, such as example methods 600 and/or 700. For instance, such execution can cause a processor (e.g., one of the processor(s) 514) that executes the at least one component to carry out a disclosed example method. It should be appreciated that, in one aspect, a processor of the processor(s) 514 that executes at least one of the upgrade/probe component(s) 536 can retrieve information from or retain information in one or more memory elements 540 in the functionality information storage 538 in order to operate in accordance with the functionality programmed or otherwise configured by the upgrade/probe component(s) 536. The one or more memory elements 540 may be referred to as upgrade/probe information 540. Such information can include at least one of code instructions, information structures, or the like.

As illustrated, the electronic device 510 also can include an upgrade/probe unit 528 which can be referred to as upgrade/probe circuitry, and can include at least one of the receiver(s) 420, the power supply unit 430, or the control unit 440. It should be appreciated that while in the illustrated embodiment of the electronic device 510, the upgrade/probe unit 528 is presented as a stand-alone functional component, in other embodiments, at least a portion of the upgrade/probe unit 528 can be embodied in a combination of component(s) retained in the functionality instructions storage 534 and at least one of the processor(s) 514. In addition, the electronic device 510 also can include a device functionality platform 524 that can include units, modules, components, processors, memory devices, other circuitry, and/or other functional elements that can provide specific functionality of the electronic device 510. For example, in an embodiment in which the electronic device 510 is embodied in a code-reader device (e.g., a barcode scanner or other type of feature-recognition scanner), the device functionality platform 524 can include lighting component (such as light sources), sensing components (such as light sensors or photodetectors), circuitry for information encoding/decoding, adapters, processors, memory devices, combinations thereof, or the like. For another example, in an embodiment in which the electronic device 510 is a television set, the device functionality platform 524 can include lighting components (such as light emitting diodes), other display components, circuitry for power management, circuitry for information encoding/decoding, loud speakers, one or more processors, memory devices, numerous adapters, and the like. Similarly, in another example, in an embodiment in which the electronic device 510 is a smartphone, the device functionality platform 524 can include lighting components (such as light emitting diodes), other display components, light sensors, circuitry for power management, telephony components, loud speakers, haptic sensors, accelerometers or other navigation sensors, one or more processors, memory devices, numerous adapters, and the like.

At least one of the one or more interfaces 550 (e.g., application programming interface(s)) can permit or facilitate communication of information between two or more components within the functionality instructions storage 534. The information that is communicated by the at least one interface can result from implementation of one or more operations in a method of the disclosure. In certain embodiments, one or more of the functionality instructions storage 534 and the functionality information storage 538 can be embodied in or can include removable/non-removable, and/or volatile/non-volatile computer storage media.

At least a portion of at least one of the upgrade/probe component(s) 536 or upgrade/probe information 540 can program or otherwise configure one or more of the processor(s) 514 to operate at least in accordance with the functionality described herein. One or more of the processor(s) 514 can execute at least one of the upgrade/probe component(s) 536 and leverage at least a portion of the information in the functionality information storage 538 in order to provide information upgrade and/or operational testing of packaged electronic devices in accordance with one or more aspects described herein.

It should be appreciated that, in certain scenarios, the functionality instructions storage 534 can embody or can include a computer-readable non-transitory storage medium having computer-accessible instructions that, in response to execution, cause at least one processor (e.g., one or more of the processor(s) 514) to perform a group of operations comprising the operations or blocks described in connection with the disclosed methods.

In addition, the memory 530 can include computer-accessible instructions and information (e.g., data, metadata, and/or programming code instructions) that permit or facilitate the operation and/or administration (e.g., upgrades, software installation, any other configuration, or the like) of the electronic device 510. Accordingly, as illustrated, the memory 530 can include a memory element 542 (labeled operating system (OS) instruction(s) 542) that contains one or more program modules that embody or include one or more operating systems, such as Windows operating system, Unix, Linux, Symbian, Android, Chromium, and substantially any OS suitable for mobile computing devices or tethered computing devices. In one aspect, the operational and/or architectural complexity of the electronic device 510 can dictate a suitable OS. The memory 330 also includes system information storage 546 having data, metadata, and/or programming code that permits or facilitates the operation and/or administration of the electronic device 510. Elements of the OS instruction(s) 542 and the system information storage 546 can be accessible or can be operated on by at least one of the processor(s) 514.

It should be recognized that while the functionality instructions storage 534 and other executable program components, such as the OS instruction(s) 542, are illustrated herein as discrete blocks, such software components can reside at various times in different memory components of the electronic device 510, and can be executed by at least one of the processor(s) 514. In certain scenarios, an implementation of the upgrade/probe component(s) 536 can be retained on or transmitted across some form of computer-readable media.

The electronic device 510 may include a power supply (not shown) in addition to any inductive power supply components that may be present in the upgrade/probe unit 528. The power supply can power up components or functional elements within such devices. The power supply can be a rechargeable power supply, e.g., a rechargeable battery, and it can include one or more transformers to achieve a power level suitable for the operation of the electronic device 510 and components, functional elements, and related circuitry therein. In certain scenarios, the power supply can be attached to a conventional power grid to recharge and ensure that such devices can be operational. In one aspect, the power supply can include an I/O interface (e.g., one of the network adapter(s) 518) to connect operationally to the conventional power grid. In another aspect, the power supply can include an energy conversion component, such as a solar panel, to provide additional or alternative power resources or autonomy for the electronic device 510.

It should be appreciated that, in certain embodiments, the electronic device 510 can operate in a networked environment by utilizing connections to one or more remote computing devices and/or sensors (not depicted in FIG. 5). As an illustration, a remote computing device can be a personal computer, a portable computer, a server, a router, a network computer, a peer device or other common network node, and so on. As described herein, connections (physical and/or logical) between the electronic device 510 and a remote computing device or sensor can be made via one or more traffic and signaling pipes, which can include wired link(s) and/or wireless link(s) and several network elements (such as routers or switches, concentrators, servers, and the like) that form a local area network (LAN), a wide area network (WAN), and/or other networks (wireless or wired) having different footprints. Such networking environments are conventional and commonplace in dwellings, offices, enterprise-wide computer networks, intranets, local area networks, and wide area networks.

In one or more embodiments, one or more of the disclosed methods can be practiced in distributed computing environments, such as grid-based environments, where tasks can be performed by remote processing devices (e.g., network servers) that are functionally coupled (e.g., communicatively linked or otherwise coupled) through a network having traffic and signaling pipes and related network elements. In a distributed computing environment, in one aspect, one or more software components (such as program modules) may be located in both the electronic device 510 and at least one remote computing device.

Figure 6:
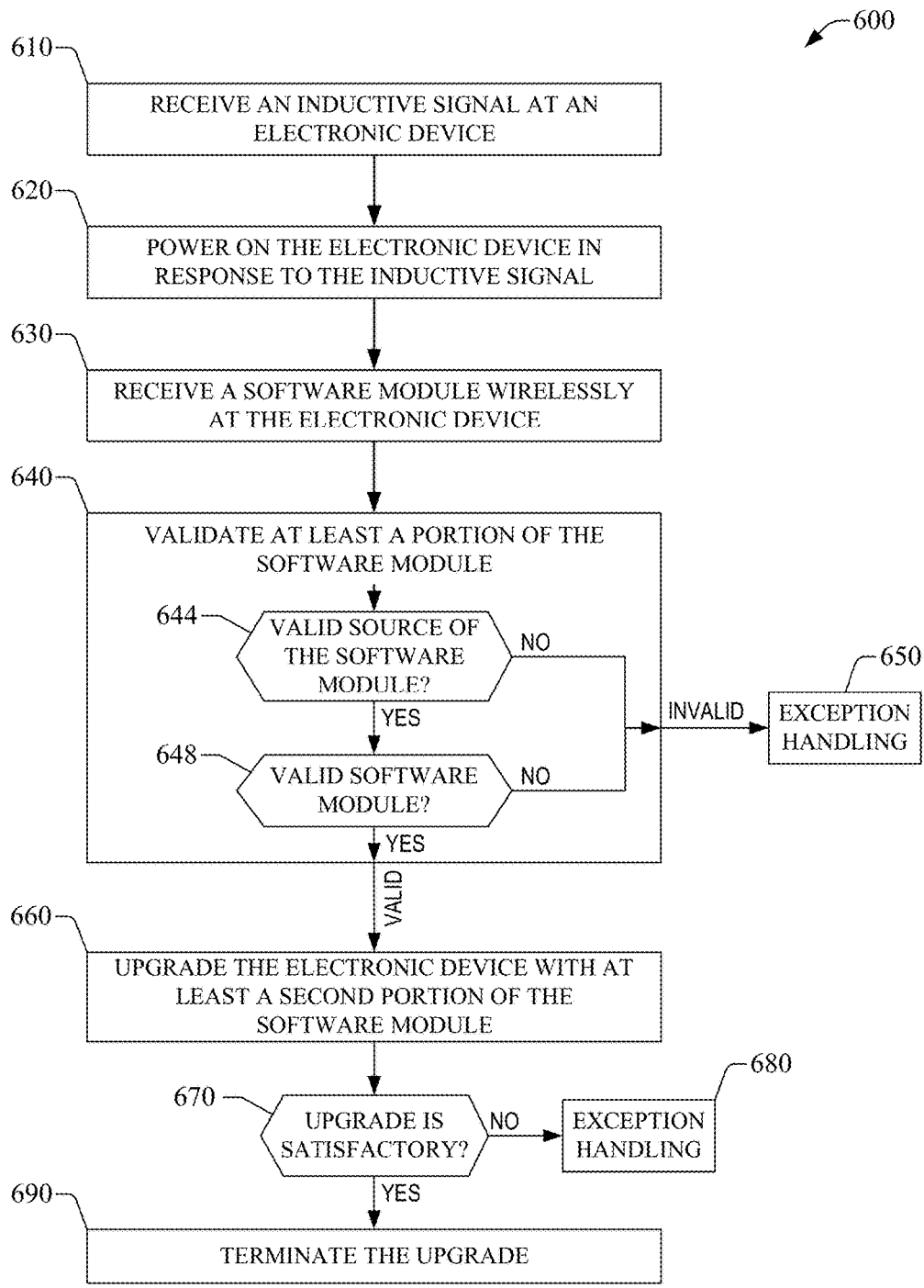
FIGS. 6-8 illustrate examples of methods in accordance with one or more embodiments of the disclosure.
Figure 7:
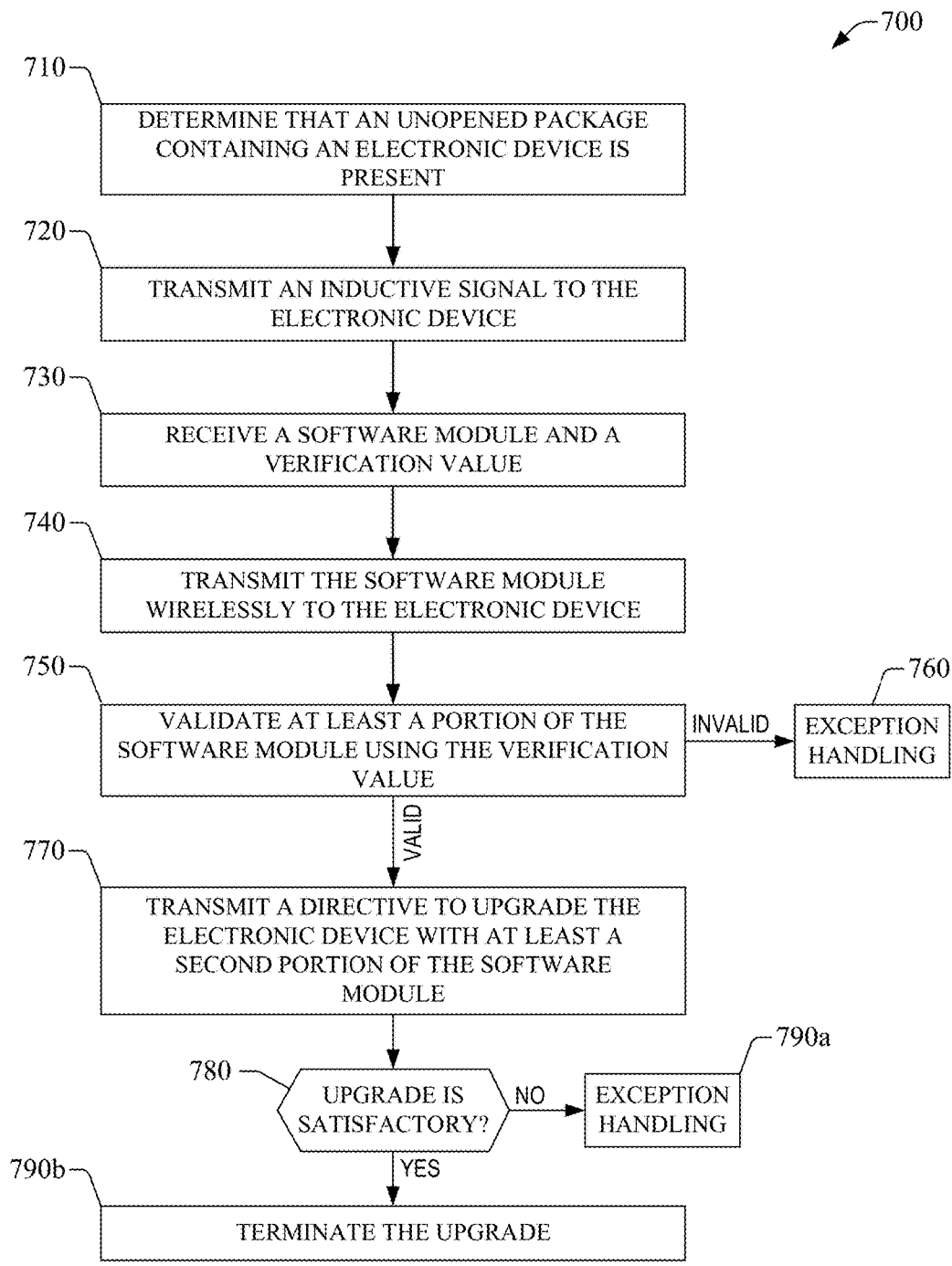
Figure 8:
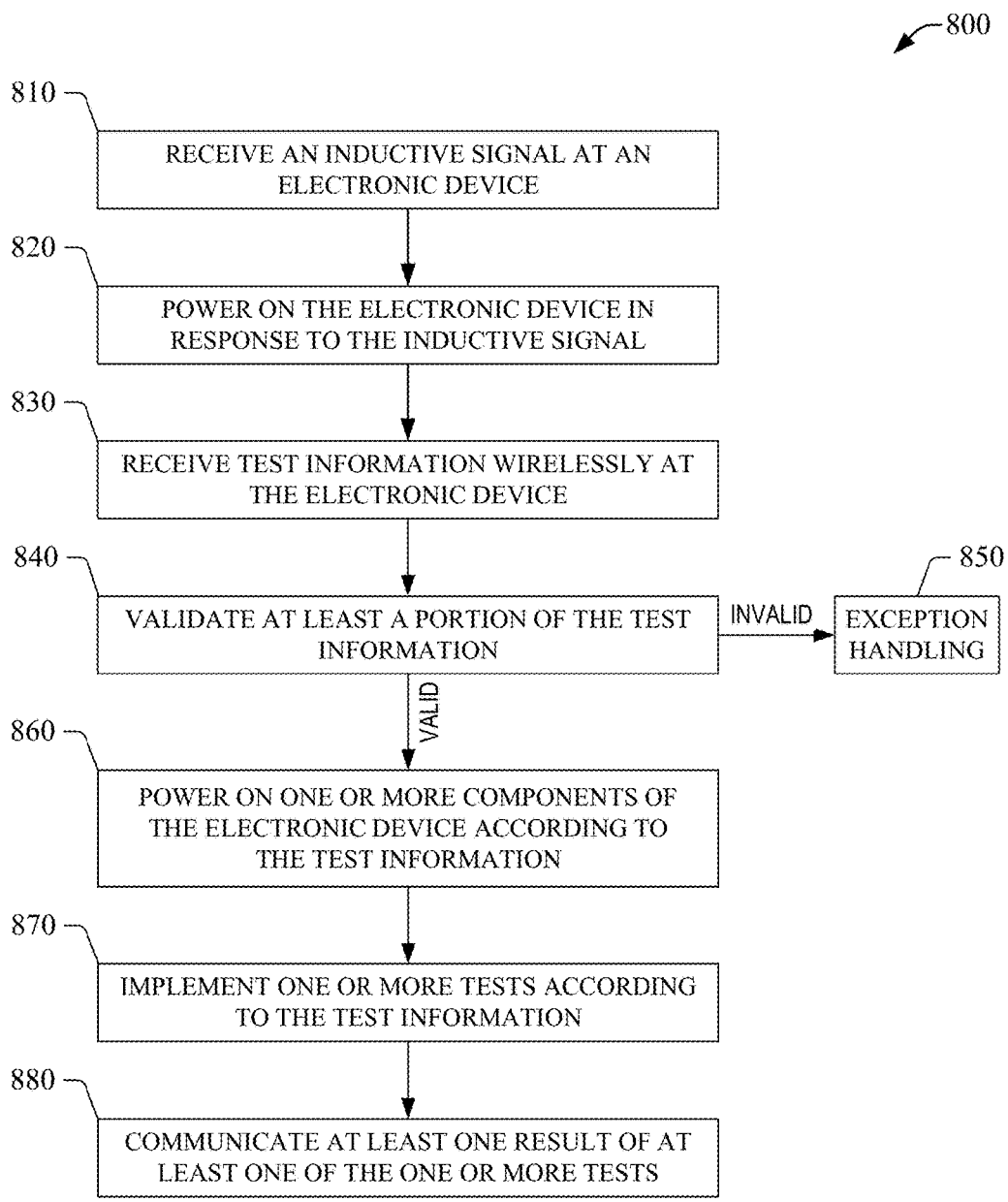

In view of the aspects described herein, example methods that can be implemented in accordance with the disclosure can be better appreciated with reference, for example, to the flowcharts in FIGS. 6-8. For purposes of simplicity of explanation, the example methods disclosed herein are presented and described as a series of blocks (with each block representing an action or an operation in a method, for example). However, it is to be understood and appreciated that the disclosed methods are not limited by the order of blocks and associated actions or operations, as some blocks may occur in different orders and/or concurrently with other blocks from those that are shown and described herein. For example, the various methods (or processes or techniques) in accordance with this disclosure can be alternatively represented as a series of interrelated states or events, such as in a state diagram. Furthermore, not all illustrated blocks, and associated action(s), may be required to implement a method in accordance with one or more aspects of the disclosure. Further yet, two or more of the disclosed methods or processes can be implemented in combination with each other, to accomplish one or more features or aspects described herein.

It should be appreciated that the methods in accordance with this disclosure can be retained on an article of manufacture, or computer-readable medium, to permit or facilitate transporting and transferring such methods to a computing device (such as an electronic device of this disclosure; a programmable logic controller; or the like) for execution, and thus implementation, by a processor of the computing device or for storage in a memory thereof or functionally coupled thereto. In one aspect, one or more processors, such as processor(s) that implement (e.g., execute) one or more of the disclosed methods, can be employed to execute code instructions retained in a memory, or any computer- or machine-readable medium, to implement the one or more of the disclosed methods. The code instructions can provide a computer-executable or machine-executable framework to implement the methods described herein.

FIG. 6 presents a flowchart of an example method 600 for upgrading packaged electronic devices according to one or more aspects of the disclosure. In certain embodiments, the electronic devices can be upgraded with a software module that can be embodied in or can include a group of computer-accessible instructions and/or computer-accessible information (e.g., data structures and/or metadata), and can represent software, firmware, or specific information for certain functionality of the electronic device. Upgrading an electronic device with the software module can include replacing or otherwise modifying software in existence or otherwise present in the electronic device with at least a portion of the software module, or installing the software module for a first time in the electronic device. In one embodiment, an electronic device having power supply circuitry and transceivers as described herein, one or more processors, and one or more memory devices can implement (e.g., compile, execute, compile and execute, or the like) one or more blocks of the subject example method. In certain embodiments, the electronic device 410 can implement the subject example method. In other embodiments, the electronic device 510 can implement the subject example method.

At block 610, an inductive signal can be received at the electronic device. At block 620, the electronic device can be powered on in response to the inductive signal. To at least such an end, in certain embodiments, the electronic device can transition from a power-off state to a power-state in response to receiving at least a portion of the inductive signal. At block 630, a software module can be received wirelessly by the electronic device. While in certain embodiments, the inductive signal at block 610 can be received prior to receiving the software module, it should be appreciated that, in certain embodiments, the inductive signal at block 610 can be received concurrently or nearly concurrently with at least a portion of the software module at block 630. Therefore, in one example, the electronic device can be powered on at block 630 for at least the duration of the reception of the software module.

At block 640, the software module can be validated. As illustrated, to validate the software module, at block 644, it can be determined if a source of the software module is valid. In response to ascertaining or otherwise establishing that such a source is invalid, an exception can be handled at block 650. In the alternative, in response to ascertaining or otherwise establishing that the source of the software module is valid, at block 648, it can be determined if the software module is valid. For example, the integrity, authenticity, and/or the type of the software module can be determined. More specifically, yet not exclusively, the electronic device of the subject example method can determine the presence of errors or other types of lack of integrity in the software module. As such, as described herein, the electronic device can determine (e.g., compute) a verification value using at least a portion of the software module as an input to the determination. The verification value may be referred to as an "error-detection value" and can include a checksum value, a hash value, or a value obtained from computation of a predetermined verification function, such as a checksum algorithm or hash function.

In response to a determination that the software module is invalid, the flow of the example subject method can be directed to block 650. In the alternative, in response to a determination that the software module is valid, the electronic device can be upgraded using at least a second portion of the software module at block 660. As described herein, upgrading the electronic device in such a fashion can include replacing or otherwise modifying software in existence or otherwise present in the electronic device with at least the second portion of the software module, or installing at least the second portion of the software module for a first time in the electronic device. It should be appreciated that in certain embodiments, upgrading the electronic device with at least the second portion of the software module can include partitioning such a portion into two other portions, a third portion and a fourth portion of the software module, and replacing or otherwise modifying software in existence or otherwise present in the electronic device with the third portion of the software module and installing the fourth portion of the software module for a first time in the electronic device.

It should be appreciated that in other embodiments, validation of the software module can be distributed between the electronic device that receives the software module and a remote electronic device that provides the software module. For instance, the electronic device can determine an error-detection value and can transmit it to the remote electronic device. The remote electronic device can receive the error-detection value and can determine or otherwise verify the correctness of such a value. To that end, for example, the received error-detection value can be compared to a predetermined verification value that can serve as a reference value. A comparison that indicates that the received error-detection value is the same (e.g., strictly equal or substantially equal) as the reference value, the remote device can establish that the software module has been correctly received at the electronic device—e.g., the software module has been received without errors and/or does not present other type of integrity issues. The remote device can transmit a signal indicative or otherwise representative of the validity of the software to the electronic device. In addition or in another embodiment, the remote device can transmit a second signal indicative or otherwise representative of a directive to proceed with implementing block 660. As such, the directive can cause the electronic device to implement block 660 in response to signal and/or the second signal.

At block 670, the electronic device can determine if the upgrade of the electronic device is satisfactory—e.g., at least the second portion of the software module has been successfully stored and/or provisioned in the electronic device; integrity of at least the second portion of the software module has been preserved during and/or after the upgrade; a combination thereof; or the like. In certain embodiments, the electronic device can utilize or otherwise leverage a functional element therein, such as the validation unit described herein, to determine if the software upgrade is satisfactory. As described herein, the upgrade of the electronic device can include replacement of software existent or otherwise present in the electronic device or initial installation of software in the electronic device. A determination that the upgrade is unsatisfactory can lead to block 680, at which exception handling is implemented. In one implementation, exception handling can include transmitting information indicative or otherwise representative of an inadequate upgrade. Such information can include, for example, identification information of the electronic device; identification information of the software module or portion thereof utilized in the unsatisfactory upgrade; a time stamp; a directive to attempt the upgrade at least one additional time; a request to repeat the upgrade at least one additional time; a combination thereof, or the like. A remote device (e.g., a base station, a server, or both) can receive such information and implement appropriate corrective action, such as grant the request to repeat the upgrade, which can include transmitting, from the remote device to the electronic device, the software module at least one additional time. In certain embodiments, such as the example embodiments shown in FIG. 3, the remote device or a device functionally coupled thereto can implement certain operations directed to isolate or otherwise manage out the electronic device from a manufacturing process or a fulfillment process. Such operation can include, for example, moving the electronic device to a dedicated area in a factory or a fulfillment center.

A determination at block 670 that the upgrade is satisfactory can lead to block 690, at which the upgrade can be terminated. In certain embodiments, terminating the upgrade can include powering off the electronic device. For example, the electronic device can receive a signal indicative or otherwise representative of a directive to power off the electronic device. As such, in response to receiving the signal, the electronic device can transition from the power-on state to the power-off state. In addition or in the alternative, terminating the upgrade can include transmitting a confirmation and/or other type of information indicative or representative of a satisfactory upgrade.

In addition, while in the illustrated embodiment of the subject example method reference is made to a "software module," it should be appreciated that any digital information (e.g., operating system upgrades; software; firmware; user credentials; user profiles; network configurations; digital media, such as an audio segment, a video segment, or an image; or the like) can be received at the electronic device. In addition, while the software module received at an electronic device is validated, numerous other validation mechanisms prior to proceeding with the upgrading of the electronic device may be implemented. More specifically, in certain embodiments, the number of times the electronic device is powered on (e.g., caused to transition from a power-off state to a power-on state) can be monitored by the electronic device (via a controller therein, for example). When the electronic device determines that it has been powered on more than a predetermined number of time (e.g., one time, two times, and so forth), the electronic device can block or otherwise prevent receiving the software module. Such a mechanism can lock the electronic device for more than a certain number of software upgrades, where additional software upgrades include unlocking or otherwise reconfiguring the device externally (wirelessly or otherwise) to permit further upgrades.

FIG. 7 presents a flowchart of an example method 700 for upgrading packaged electronic devices according to one or more aspects of the disclosure. As described herein, the electronic devices can be upgraded with a software module that can be embodied in or can include a group of computer-accessible instructions and/or computer-accessible information (e.g., data structures and/or metadata), and can represent software, firmware, or specific information for certain functionality of the electronic device. Upgrading an electronic device with the software module can include replacing or otherwise modifying software in existence or otherwise present in the electronic device with at least a portion of the software module, or installing the software module for a first time in the electronic device. Similarly to the example method 600, while the subject example method 700 refers to a "software module," it should be appreciated that any digital information can be upgraded or caused to be upgraded at the electronic device. In certain embodiments, a device having transceivers, one or more processors, and one or more memory devices in accordance with this disclosure can implement (e.g., compile, execute, compile and execute, or the like) one or more blocks of the subject example method. For example, the device 210 can implement the subject example method. In other embodiments, the subject example method can be implemented in a distributed fashion, where two or more devices (e.g., a charging device and a base station) can implement different portions of the subject example method. It should be appreciated that the two or more electronic device can be embodied in or can be included in a single system of platform for upgrading an electronic device contained in an unopened package.

At block 710, it is determined if an unopened package containing an electronic device is present. Such a determination can be performed in numerous ways. In one example, the device or one of the devices that implements the subject example method can include detection circuitry that in proximity to the unopened package can produce a signal (which may be referred to as a "presence" signal) that indicates that the unopened package is present and contains the electronic device. In another example, an image from a camera can be analyzed (e.g., utilizing computerized vision) to determining that the unopened package is present, and the weight of the unopened package can be measured and compared to a reference weight indicative of the unopened package containing the electronic device. To at least such an end, in one embodiment, a weight scale can be integrated into or coupled to a shelf or a conveyor belt that holds the unopened package, and can transmit information indicative of the weight of the unopened package to a device that implements the subject example method. Such a device can compare the weight to the reference weight and thus determine the presence of the electronic device within the unopened package.

At block 720, an inductive signal can be transmitted to the electronic device that is present in the unopened package. The inductive signal can cause the electronic device to transition from a power-off state to a power-on state. Therefore, the electronic device can be powered on via the inductive signal. In one embodiment, as described herein, the electronic device 210 can transmit the inductive signal.

At block 730, a software module and a verification value can be received at the device or one of the devices that implements the subject example method. As described herein, the verification value may be referred to as an error-detection value and can include a checksum value, a hash value, or other type of value determined from a verification function (e.g., a checksum algorithm, a hash function, or the like). In one embodiment, the electronic device 210 can receive the software module and the verification value from a remote device (e.g., a server, such as one of the server(s) 290). In another embodiment, the base station 270 can receive the software module and the verification value from one of the server(s) 290. It should be appreciated that, in certain embodiments of the subject example method, the software module and/or the verification value can be present or otherwise existent in the electronic device 210 and/or the base station 270. Therefore, in such embodiments, block 730 may not be implemented.

At block 740, the software module can be transmitted wirelessly to the electronic device by the device or one of the devices that implements the subject example method. More specifically, yet not exclusively, the electronic device 210 or the base station 270 can wirelessly transmit the software module to the electronic device. At block 750, at least a portion of the software module can be validated using the verification value. The device or one of the devices that implements the subject example method can validate the software module. In one implementation, in response to receiving the software module, the electronic device can determine a second verification value (e.g., a checksum value or a hash value) and can transmit such a value, or information indicative thereof, to the device that supplied the software module. As such, the device that wirelessly transmitted the software module at block 740 (e.g., the electronic device 210 or the base station 270) can receive the second verification value at block 750 as part of validation of the software module or a portion thereof. Such a device can determine or otherwise verify the correctness of the second verification value using the verification value available at block 730. To that end, for example, the received second verification value can be compared to the verification value available at block 730. A comparison that indicates that the second verification value is different from the verification value can establish that the software module has been incorrectly received at the electronic device. Therefore, the software module or a portion thereof is invalid and flow can be directed to block 760, where exception handling can be implemented. In another embodiment, a comparison that indicates that the second verification value is the same as the verification value can establish that the software module has been correctly received at the electronic device—e.g., the software module has been received without errors and/or does not present other type of integrity issues. Accordingly, the software module is valid and flow can proceed to block 770.

At block 770, a directive to upgrade the electronic device with at least a second portion of the software module can be transmitted to the electronic device. The device or one of the devices that performs the subject example method can transmit such a directive or information indicative thereof. The transmitted directive can cause the electronic device to apply the software module. As such, in response to receiving the directive, or a signal representative thereof, the electronic device can be upgraded—e.g., the electronic device can modify existing software in the electronic device using at least the second portion of the software module, or can add at least the second portion of the software module to the electronic device. In certain implementations, the software module can be embodied in or can include a software upgrade having an executable file, and the transmitted directive can cause the electronic device to apply the software upgrade by causing the electronic device to execute the executable file.

At block 780, it can be determined if the upgrade of the electronic device is satisfactory. To that end, in certain embodiments, the device or one of the devices that implements the subject example method can receive a signal (e.g., an acknowledge (ACK) signal) confirming that at least the second portion of the software module has been successfully stored and/or provisioned in the electronic device; that the integrity of at least the second portion of the software module has been preserved during and/or after the upgrade; a combination thereof; or the like. A determination that the upgrade is satisfactory can lead to block 790*b*, where the upgrade can be terminated. For instance, the device of one of the devices that implements the subject example method can transmit a termination signal (e.g., a wireless signal) indicative or representative of a directive to power off the electronic device. Therefore, such a termination signal can cause the electronic device to transition from the power-on state attained at block 720 to a power-off state. In the alternative, a determination that the upgrade is unsatisfactory can lead to block 790*a*, at which exception handling can be implemented.

In certain embodiments, in addition or in the alternative to upgrading the device, the example method 700 can include inductively charging the electronic device that is contained in an unopened package while the electronic device is in the power-on state attained at block 720. For instance, upon or after the electronic device is powered on, the inductive signal supplied (e.g., transmitted or otherwise communicated) by the electronic device 210 can charge a battery or an energy storage device integrated into or functionally coupled to the electronic device.

FIG. 8 presents a flowchart of an example method 800 for testing packaged electronic devices according to one or more aspects of the disclosure. An electronic device having power supply circuitry and transceivers as described herein, one or more processors, and one or more memory devices can implement (e.g., compile, execute, compile and execute, or the like) one or more blocks of the subject example method. In one example, the electronic device 410 can implement the subject example method. In another example, the electronic device 510 can implement the subject example method. At block 810, an inductive signal can be received at the electronic device. At block 820, the electronic device can be powered on using at least a portion of the received inductive signal. For instance, the inductive signal can cause the electronic device to transition from a power-off state to a power-on state. A controller included in the electronic device can cause the electronic device to switch between such states in response to the inductive signal. At block 830, test information can be received wirelessly by the electronic device. As described herein, the test information can include configuration information and/or one or more test instructions. At block 840, at least a portion of the test information can be validated or otherwise evaluated for correctness. For instance, the test information can be evaluated to determine if the test information was received without transmission errors and/or the type of test information is accurate. At block 850, one or more components of the electronic device can be powered on based at least on the test information. More specifically, in one embodiment, at least one of such component(s) can be identified by the configuration information included in the test information. A controller and a power supply unit that may be integrated into the electronic device can power on each of the one or more identified component(s). At block 860, one or more tests can be implemented based at least on the test information. For instance, each of the one or more tests can be implemented by implementing at least one of the test instruction(s) included in the test information. At block 870, information indicative or otherwise representative of at least one result of the one or more tests can be communicated (e.g., transmitted). The at least one result can be communicated, for example, via a radio unit of the electronic device. It should be appreciated that the radio unit can be powered on at block 850.

Various embodiments of the disclosure may take the form of an entirely or partially hardware embodiment, an entirely or partially software embodiment, or a combination of software and hardware (e.g., a firmware embodiment). Furthermore, as described herein, various embodiments of the disclosure (e.g., methods and systems) may take the form of a computer program product comprising a computer-readable non-transitory storage medium having computer-accessible instructions (e.g., computer-readable and/or computer-executable instructions) such as computer software, encoded or otherwise embodied in such storage medium. Those instructions can be read or otherwise accessed and executed by one or more processors to perform or permit the performance of the operations described herein. The instructions can be provided in any suitable form, such as source code, compiled code, interpreted code, executable code, static code, dynamic code, assembler code, combinations of the foregoing, and the like. Any suitable computer-readable non-transitory storage medium may be utilized to form the computer program product. For instance, the computer-readable medium may include any tangible non-transitory medium for storing information in a form readable or otherwise accessible by one or more computers or processor(s) functionally coupled thereto. Non-transitory storage media can include read-only memory (ROM); random access memory (RAM); magnetic disk storage media; optical storage media; flash memory, etc.

Embodiments of the operational environments and methods (or techniques) are described herein with reference to block diagrams and flowchart illustrations of methods, systems, apparatuses and computer program products. It can be understood that each block of the block diagrams and flowchart illustrations, and combinations of blocks in the block diagrams and flowchart illustrations, respectively, can be implemented by computer-accessible instructions. In certain implementations, the computer-accessible instructions may be loaded or otherwise incorporated onto a general purpose computer, special purpose computer, or other programmable information processing apparatus to produce a particular machine, such that the operations or functions specified in the flowchart block or blocks can be implemented in response to execution at the computer or processing apparatus.

Unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is in no way intended that an order be inferred, in any respect. This holds for any possible non-express basis for interpretation, including: matters of logic with respect to the arrangement of steps or operational flow; plain meaning derived from grammatical organization or punctuation; the number or type of embodiments described in the specification or annexed drawings, or the like.

As used in this application, the terms "component," "environment," "system," "architecture," "interface," "unit," "module," "pipe," and the like are intended to refer to a computer-related entity or an entity related to an operational apparatus with one or more specific functionalities. Such entities may be either hardware, a combination of hardware and software, software, or software in execution. As an example, a component may be, but is not limited to being, a process running on a processor, a processor, an object, an executable portion of software, a thread of execution, a program, and/or a computing device. For example, both a software application executing on a computing device and the computing device can be a component. One or more components may reside within a process and/or thread of execution. A component may be localized on one computing device or distributed between two or more computing devices. As described herein, a component can execute from various computer-readable non-transitory media having various data structures stored thereon. Components can communicate via local and/or remote processes in accordance, for example, with a signal (either analogic or digital) having one or more data packets (e.g., data from one component interacting with another component in a local system, distributed system, and/or across a network such as a wide area network with other systems via the signal). As another example, a component can be an apparatus with specific functionality provided by mechanical parts operated by electric or electronic circuitry that is controlled by a software application or firmware application executed by a processor, wherein the processor can be internal or external to the apparatus and can execute at least a part of the software or firmware application. As yet another example, a component can be an apparatus that provides specific functionality through electronic components without mechanical parts, and the electronic components can include a processor therein to execute software or firmware that provides, at least in part, the functionality of the electronic components. In certain embodiments, components can communicate via local and/or remote processes in accordance, for example, with a signal (either analog or digital) having one or more data packets (e.g., data from one component interacting with another component in a local system, distributed system, and/or across a network such as a wide area network with other systems via the signal). In other embodiments, components can communicate or otherwise be coupled via thermal, mechanical, electrical, and/or electromechanical coupling mechanisms (such as conduits, connectors, combinations thereof, or the like). An interface can include input/output (I/O) components as well as associated processor, application, and/or other programming components. The terms "component," "environment," "system," "architecture," "interface," "unit," "module," and "pipe" can be utilized interchangeably and can be referred to collectively as functional elements.

As utilized in this disclosure, the term "processor" can refer to any computing processing unit or device comprising single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit (IC), an application-specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. A processor can be implemented as a combination of computing processing units. In certain embodiments, processors can utilize nanoscale architectures such as, but not limited to, molecular and quantum-dot based transistors, switches and gates, in order to optimize space usage or enhance the performance of user equipment or other electronic equipment.

In addition, in the present specification and annexed drawings, terms such as "store," storage," "data store," "data storage," "memory," "repository," and substantially any other information storage component relevant to the operation and functionality of a component of the disclosure, refer to "memory components," entities embodied in a "memory," or components forming the memory. It can be appreciated that the memory components or memories described herein embody or include non-transitory computer storage media that can be readable or otherwise accessible by a computing device. Such media can be implemented in any methods or technology for storage of information such as computer-readable instructions, information structures, program modules, or other information objects. The memory components or memories can be either volatile memory or non-volatile memory, or can include both volatile and non-volatile memory. In addition, the memory components or memories can be removable or non-removable, and/or internal or external to a computing device or component. Examples of various types of non-transitory storage media can include hard-disc drives, zip drives, CD-ROM, digital versatile disks (DVD) or other optical storage, magnetic cassettes, magnetic tape, magnetic disk storage or other magnetic storage devices, flash memory cards or other types of memory cards, cartridges, or any other non-transitory medium suitable to retain the desired information and which can be accessed by a computing device.

As an illustration, non-volatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory components or memories of the operational or computational environments described herein are intended to include one or more of these and/or any other suitable types of memory.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, and techniques that can permit, in at least certain aspects, upgrading software and/or testing operation of an electronic device without removing the electronic device from its unopened packaging. It is, of course, not possible to describe every conceivable combination of elements and/or methods for purposes of describing the various features of the disclosure, but it can be recognized that many further combinations and permutations of the disclosed features are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A method for upgrading a device while the device is in a package, comprising:
    determining that the package comprising the device is present;
    transmitting a first inductive signal to the device to cause the device to transition from a power-off state to a first power-on state while the device is in the package, wherein the first power-on state comprises one or more first components of the device being powered on;
    receiving a software upgrade, wherein the software upgrade includes at least a first portion of software, and a first error-detection value, wherein the first error-detection value permits determining an error in the software upgrade;
    wirelessly transmitting the software upgrade to the device;
    receiving from the device a second error-detection value;
    comparing the first error-detection value and the second error-detection value to determine that the software upgrade was transferred to the device without errors;
    causing the device to install the software upgrade, wherein the first portion of the software was not previously installed on the device; and
    transmitting a second signal to the device to cause the device to operate in a second power-on state, wherein the second power-on state comprises one or more second components of the device being powered on.

2. The method of claim 1, further comprising inductively charging the device while the device is in the first power-on state.

3. The method of claim 1, wherein the first error-detection value comprises a checksum value, a cyclic redundancy check (CRC) value, or a hash value.

4. The method of claim 1, wherein the software upgrade comprises an executable file, and wherein causing the device to install the software upgrade comprises causing the device to execute the executable file.

5. The method of claim 1, wherein the one or more first components and the one or more second components comprise different components.

6. A method comprising:
    transitioning from a power-off state to a first power-on state in response to receiving an inductive signal, wherein the first power-on state comprises one or more first components of an electronic device being powered on;

receiving information wirelessly, wherein the information includes software, wherein the software is configured to permit at least one of modifying an existing software or adding new software;

receiving a first signal;

causing to install at least a first portion of the software, wherein the first portion of the software was not previously installed on the electronic device; and causing the electronic device to operate in a second power-on state, the second power-on state comprising one or more second components of the electronic device being powered on.

7. The method of claim 6, the method further comprising inductively charging the electronic device while the electronic device is in the first power-on state.

8. The method of claim 6, wherein receiving the information wirelessly comprises receiving the information using a radio technology protocol.

9. The method of claim 6, further comprising validating the software, wherein validating comprises determining an error-detection value using at least a portion of the software,
comparing the error-detection value to a second error-detection value, and
transmitting a signal indicative of the validity of the software when the error-detection value is the same as the second error-detection value.

10. The method of claim 6, the method further comprising determining an error-detection value using the software, and
transmitting the error-detection value.

11. The method of claim 10, wherein determining the error-detection value comprises computing a checksum value, a cyclic redundancy check (CRC) value, or a hash value.

12. The method of claim 6, wherein the one or more first components and the one or more second components comprise different components.

13. An electronic device, comprising:
a charging receiver configured to receive an inductive signal;
a controller configured to switch the electronic device from a power-off state to a first power-on state using the inductive signal, wherein the first power-on state comprises one or more first components of the electronic device being powered on;
a radio unit configured to receive information wirelessly, wherein the information includes software comprising a first portion of the software; and
at least one processor configured to cause to install at least the first portion of the software, wherein the first portion of the software was not previously installed on the electronic device;
wherein the radio unit is further configured to receive test information wirelessly while the electronic device is in the first power-on state, the test information comprising one or more of configuration information or a test directive;
wherein the at least one processor is further configured to apply the test directive to one or more second components of the electronic device; and
wherein the controller is further configured to cause the electronic device to operate in a second power-on state, wherein the causing the electronic device to operate in the second power-on state further comprises powering on the one or more second components of the electronic device.

14. The electronic device of claim 13, further comprising a power supply unit configured to inductively charge the electronic device while the electronic device is in the first power-on state.

15. The electronic device of claim 13, wherein the radio unit is further configured to receive the information wirelessly using a radio technology protocol.

16. The electronic device of claim 13, wherein the at least one processor is further configured to validate the software comprised in the information, wherein the software is configured to permit modification of an existing software or addition of new software.

17. The electronic device of claim 16, wherein the at least one processor is further configured to:
determine an error-detection value using at least a second portion of the software,
compare the error-detection value to a second error-detection value, and
transmit a signal indicative of the validity of the software when the error-detection value is the same as the second error-detection value.

18. The electronic device of claim 13, wherein the at least one processor is further configured to:
determine an error-detection value using the software comprised in the information, wherein the software is configured to permit modifying an existing software or adding new software, and
transmit the error-detection value.

19. The electronic device of claim 18, wherein the at least one processor is further configured to compute a checksum value, a cyclic redundancy check (CRC) value, or a hash value.

20. The electronic device of claim 13, wherein at least one of the one or more first components or at least one of the one or more second components is configured to provide at least one result, and wherein the radio unit is further configured to transmit the at least one result.

21. The electronic device of claim 13, wherein the one or more first components and the one or more second components comprise one of the same components or different components.

* * * * *